United States Patent
Okamoto

(10) Patent No.: US 11,291,151 B2
(45) Date of Patent: Mar. 29, 2022

(54) SURFACE MOUNTER, COMPONENT RECOGNITION DEVICE AND COMPONENT RECOGNITION METHOD

(71) Applicant: YAMAHA HATSUDOKI KABUSHIKI KAISHA, Iwata (JP)

(72) Inventor: Manabu Okamoto, Iwata (JP)

(73) Assignee: YAMAHA HATSUDOKI KABUSHIKI KAISHA, Shizuoka (JP)

(*) Notice: Subject to any disclaimer, the term of this patent is extended or adjusted under 35 U.S.C. 154(b) by 549 days.

(21) Appl. No.: 16/466,567

(22) PCT Filed: Dec. 7, 2016

(86) PCT No.: PCT/JP2016/086363
§ 371 (c)(1),
(2) Date: Jun. 4, 2019

(87) PCT Pub. No.: WO2018/105051
PCT Pub. Date: Jun. 14, 2018

(65) Prior Publication Data
US 2020/0077551 A1 Mar. 5, 2020

(51) Int. Cl.
H05K 13/08 (2006.01)
G06T 7/70 (2017.01)
H05K 13/04 (2006.01)

(52) U.S. Cl.
CPC .......... *H05K 13/0815* (2018.08); *G06T 7/70* (2017.01); *G06T 2207/30204* (2013.01); *H05K 13/0419* (2018.08)

(58) Field of Classification Search
CPC ............ G06T 7/70; G06T 2207/30204; H05K 13/0419; H05K 13/0815
See application file for complete search history.

(56) References Cited

U.S. PATENT DOCUMENTS

| | | | | |
|---|---|---|---|---|
| 5,278,634 A | * | 1/1994 | Skunes | G01D 5/342 356/400 |
| 5,467,186 A | * | 11/1995 | Indo | H05K 13/0812 356/150 |

(Continued)

FOREIGN PATENT DOCUMENTS

| JP | H02-10204 A | 1/1990 |
|---|---|---|
| JP | 2015-517222 A | 6/2015 |
| JP | 2015-126216 A | 7/2015 |

OTHER PUBLICATIONS

An Office Action mailed by the Korean Intellectual Property Office dated Sep. 14, 2020, which corresponds to Korean Patent Application No. 10-2019-7012490 and is related to U.S. Appl. No. 16/466,567 with English language translation.

(Continued)

*Primary Examiner* — Carl J Arbes
(74) *Attorney, Agent, or Firm* — Studebaker & Brackett PC

(57) ABSTRACT

A surface mounter including a component holder that holds a component, which includes a light emitter to emit light and a package having a step between the light emitter and the package along a peripheral edge of the light emitter, and a light irradiator that forms a first shadow along the step by irradiating light toward the component. The component holder further includes an imager that images an image including the first shadow, a position recognizer that recognizes a position of the light emitter from a position of the imaged first shadow, a mounting head that mounts the component taken out from the component holder on a board, and a mounting controller that controls a position where the mounting head mounts the component on the board on the basis of the position of the light emitter recognized by the position recognizer.

18 Claims, 6 Drawing Sheets

(56) References Cited

U.S. PATENT DOCUMENTS

| | | | | |
|---|---|---|---|---|
| 5,745,241 A * | 4/1998 | Hashimoto | ........ | H05K 13/0813 |
| | | | | 356/635 |
| 5,878,484 A * | 3/1999 | Araya | ................ | H05K 13/0812 |
| | | | | 29/740 |
| 6,538,244 B1 * | 3/2003 | Skunes | ................ | G01B 11/024 |
| | | | | 250/208.1 |
| 8,634,079 B2 * | 1/2014 | Onishi | ................ | H05K 13/041 |
| | | | | 356/446 |
| 10,271,436 B2 * | 4/2019 | Inoue | ................ | H05K 13/0813 |
| 2004/0139597 A1 * | 7/2004 | Oyama | ............. | H05K 13/0813 |
| | | | | 29/743 |
| 2006/0158831 A1 * | 7/2006 | Sakai | ................ | H05K 13/0812 |
| | | | | 361/600 |
| 2016/0255752 A1 * | 9/2016 | Inoue | ................ | H05K 13/0813 |
| | | | | 29/834 |

OTHER PUBLICATIONS

International Search Report issued in PCT/JP2016/086363; dated Mar. 14, 2017.

* cited by examiner

SURFACE MOUNTER, COMPONENT RECOGNITION DEVICE AND COMPONENT RECOGNITION METHOD

CROSS-REFERENCE TO RELATED APPLICATION

This application is a National Stage of International Patent Application No. PCT/JP2016/086363, filed Dec. 7, 2016, the entire contents of which is incorporated herein by reference.

BACKGROUND

Technical Field

The disclosure relates to a technique for recognizing the position of a light emitter of a component configured to emit light from the light emitter.

Background Art

For example, when mounting a component including a light emitter such as a surface mounting type LED (Light Emitting Diode) on a board, the position of the light emitter may be required to be aligned with a predetermined position on the board. Accordingly, in a surface mounter disclosed in JP2015-126216, an illuminator for illuminating light for exciting phosphors constituting a light emitter is equipped. The position of the light emitter is recognized on the basis of an image obtained by imaging the light emitter emitting light upon receiving the light from this illuminator.

SUMMARY

By causing the light emitter to emit light in this way, a boundary between a package adjacent to the light emitter and the light emitter becomes clear, wherefore the position of the light emitter can be precisely recognized. However, LEDs including no phosphor in a light emitter also exist and the above method is not necessarily effective for such components.

The disclosure thus provides a technique enabling the position of a light emitter to be precisely recognized regardless of whether or not the light emitter of a component includes phosphors.

A surface mounter according to the disclosure comprises a component holder that holds a component which includes a light emitter to emit light and a package having a step between the light emitter and the package along a peripheral edge of the light emitter; a light irradiator that forms a first shadow along the step by irradiating light toward the component; and an imager that images an image including the first shadow. The surface mounter further comprises a position recognizer that recognizes a position of the light emitter from a position of the imaged first shadow; a mounting head that mounts the component taken out from the component holder on a board; and a mounting controller that controls a position where the mounting head mounts the component on the board on the basis of the position of the light emitter recognized by the position recognizer.

A component recognition device according to the disclosure comprises a light irradiator that irradiates a light toward a component including a light emitter to emit light and a package having a step between the light emitter and the package along a peripheral edge of the light emitter to forms a shadow along the step; an imager that images an image including the shadow; and a position recognizer that recognizes a position of the light emitter on the basis of a position of the imaged shadow.

A component recognition method according to the disclosure, comprises forming a shadow along a step by irradiating light toward a component including a light emitter to emit light and a package having the step between the light emitter and the package along a peripheral edge of the light emitter; imaging an image including the shadow; and recognizing a position of the light emitter from a position of the imaged shadow.

The disclosure (surface mounter, component recognition device, component recognition method) thus configured forms a shadow (first shadow) along the step between the light emitter and the package of the component by irradiating a light toward the component. Thus, a boundary between the package adjacent to the light emitter and the light emitter is emphasized by the shadow, wherefore the position of the light emitter of the component can be precisely recognized regardless of whether or not the light emitter of the component includes phosphors.

According to the disclosure, it is possible to precisely recognize the position of the light emitter regardless of whether or not the light emitter of the component includes phosphors.

DETAILED DESCRIPTION

Figure 1:
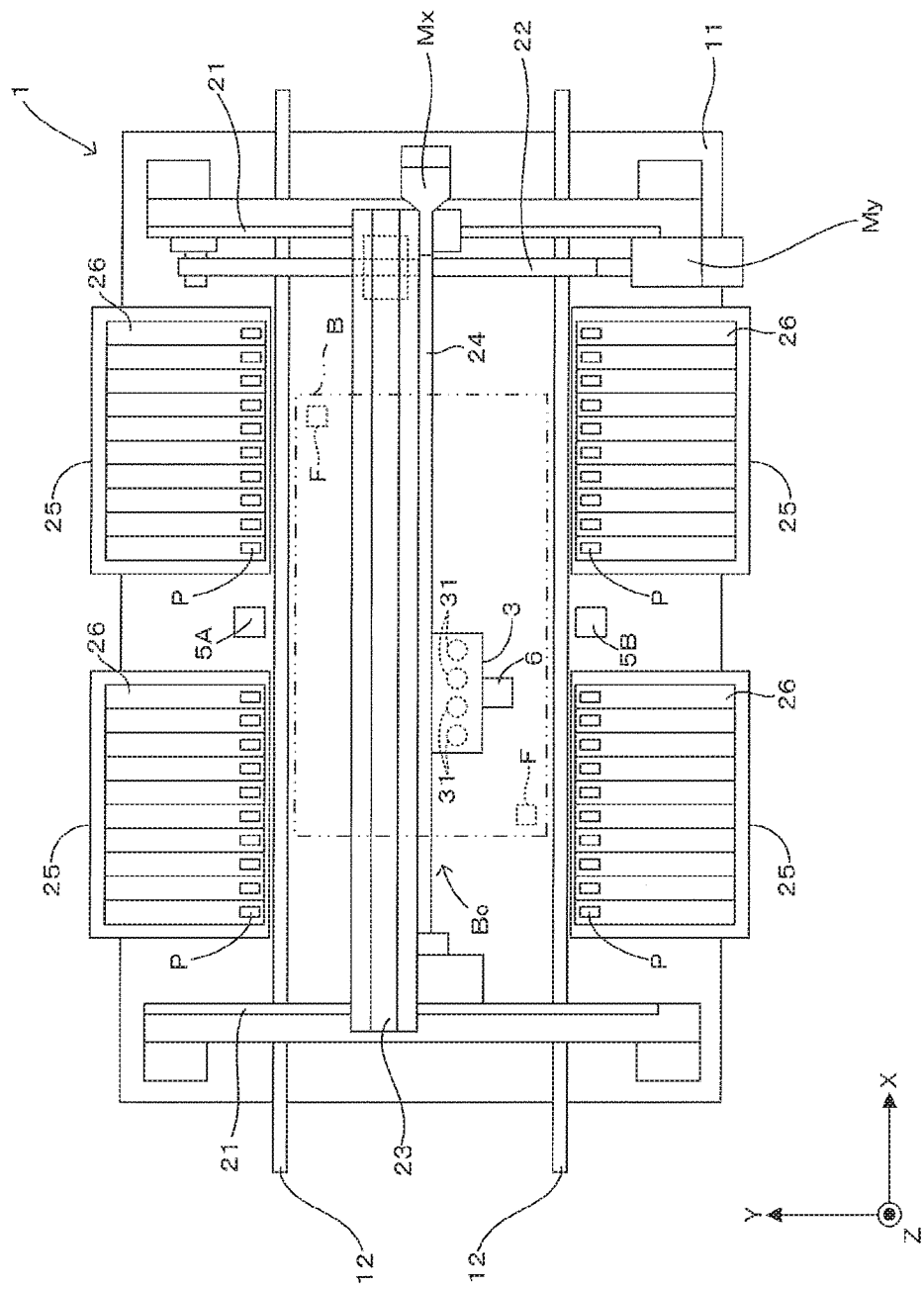
FIG. 1 is a partial plan view schematically showing an example of a surface mounter according to the disclosure.

FIG. 1 is a partial plan view schematically showing an example of a surface mounter according to the disclosure. An XYZ Cartesian coordinate system composed of a Z direction parallel to a vertical direction and an X direction and a Y direction respectively parallel to a horizontal direction is shown in FIG. 1. This surface mounter 1 includes a pair of conveyors 12, 12 provided on a base 11. The surface mounter 1 mounts components P on a board B loaded to an operating position Bo (position of the board B of FIG. 1) from an upstream side in the X direction (board conveying direction) by the conveyors 12 and unloads the board B having the components completely mounted thereon to a downstream side in the X direction from the operating position by the conveyors 12.

A pair of Y-axis rails 21, 21 extending in the Y direction, a Y-axis ball screw 22 extending in the Y direction and a Y-axis motor My for rotationally driving the Y-axis ball screw 22 are provided in the surface mounter 1, and a head supporting member 23 is fixed to a nut of the Y-axis ball screw 22 while being supported on the pair of Y-axis rails 21, 21 movably in the Y direction. An X-axis ball screw 24 extending in the X direction orthogonal to the Y direction and an X-axis motor Mx for rotationally driving the X-axis ball screw 24 are mounted on the head supporting member 23, and a head unit 3 is fixed to a nut of the X-axis ball screw 24 while being supported on the head supporting member 23 movably in the X direction. Thus, the head unit 3 can be moved in the Y direction by rotating the Y-axis ball screw 22 by the Y-axis motor My or can be moved in the X direction by rotating the X-axis ball screw 24 by the X-axis motor Mx.

Two component supply units 25 are arranged in the X direction on each of both sides of the pair of conveyors 12, 12 in the Y direction, and a plurality of tape feeders 26 arranged in the X direction are detachably attached to each component supply unit 25. Each tape feeder 26 is loaded with a tape accommodating the components P respectively in a plurality of pockets arranged in the Y direction. Each tape feeder 26 feeds this tape in the Y direction (toward the conveyor 12) to supply the component P to a component take-out position provided on the tip thereof on the side of the conveyor 12.

The head unit 3 includes a plurality of (four) mounting heads 31 arranged in the X direction. Each mounting head 31 has an elongated shape extending in the Z direction and can suck and hold the component by a nozzle disengageably mounted on the lower end thereof. That is, the mounting head 31 moves to a position above the component take-out position and sucks the component P supplied to the component take-out position by the tape feeder 26. Subsequently, the mounting head 31 moves to a position above the board B at the operating position Bo and releases the sucked component P to mount the component P on the board B. In this way, the mounting head 31 performs component mounting by taking out the component P supplied to the component take-out position by the tape feeder 26 and mounting the component P on the board B.

Further, the surface mounter 1 includes two upper recognizers 5A, 5B each having an upward facing camera. Out of these, the upper recognizer 5A is fixed to the base 11 between the two component supply units 25 arranged in the X direction on one side (upper side of FIG. 1) in the Y direction, and the upper recognizer 5B is fixed to the base 11 between the two component supply units 25 arranged in the X direction on the other side (lower side of FIG. 1) in the Y direction. Each of the upper recognizers 5A, 5B images the component P sucked by the mounting head 31 passing thereabove by the camera.

Further, the surface mounter 1 includes a lower recognizer 6 mounted on the head unit 3. This lower recognizer 6 is movable in the X direction and the Y direction together with the head unit 3 and used to image fiducial marks F attached to the board B loaded to the operating position Bo and the components P held by the tape feeders 26.

Figure 2:
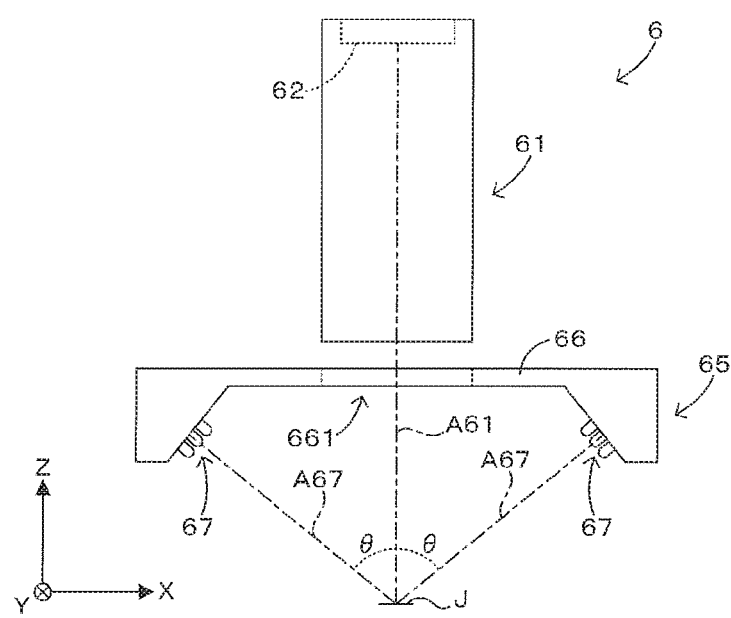
FIG. 2 is a partial side view schematically showing an example of an imager.

FIG. 2 is a partial side view schematically showing an example of an imager. As described above, the lower recognizer 6 images an imaging object J such as the component P or the fiducial mark F arranged below. This lower recognizer 6 includes a camera 61 facing the imaging object J from above. The camera 61 includes a built-in solid state image sensor 62 such as a CCD image sensor or a COMS image sensor, and images the imaging object J from above by the solid state image sensor 62. An optical axis A61 of the camera 61 is parallel to the Z direction (vertical direction), and the camera 61 faces the imaging object J in the Z direction. Note that since the component P or the fiducial mark F serving as the imaging object J is horizontally held in the surface mounter 1, a normal to a surface of the imaging object J is parallel to the optical axis A61 of the camera 61 and the Z direction.

Further, the lower recognizer 6 includes a light irradiator 65. The light irradiator 65 includes a frame 66 mounted on the camera 61. The frame 66 is arranged below the camera 61 and includes a circular opening 661 at a position facing the camera 61. Thus, the camera 61 images the imaging object J through the opening 661. Further, the light irradiator 65 includes illuminators 67 mounted on the frame 66 on both sides across the opening 661 in the X direction. Each illuminator 67 is configured by two-dimensionally arraying a plurality of light emitting elements (e.g. LEDs) for emitting light and emits light from a range wider than the imaging object J in the Y direction. An optical axis A67 of each illuminator 67 is oblique to the optical axis A61 of the camera 61 and intersects at an acute angle θ with the optical axis A61 of the camera 61. In other words, an incident angle θ of the optical axis A67 of each illuminator 67 on the imaging object J is inclined with respect to the normal to the imaging object J and each illuminator 67 irradiates light to the imaging object J from an oblique upper side.

The lower recognizer 6 having such a configuration images the imaging object J by the camera 61 while irradiating light to the imaging object J from the oblique upper side by the light irradiator 65. In this way, an imaged image of the imaging object J is obtained by the lower recognizer 6.

Figure 3:
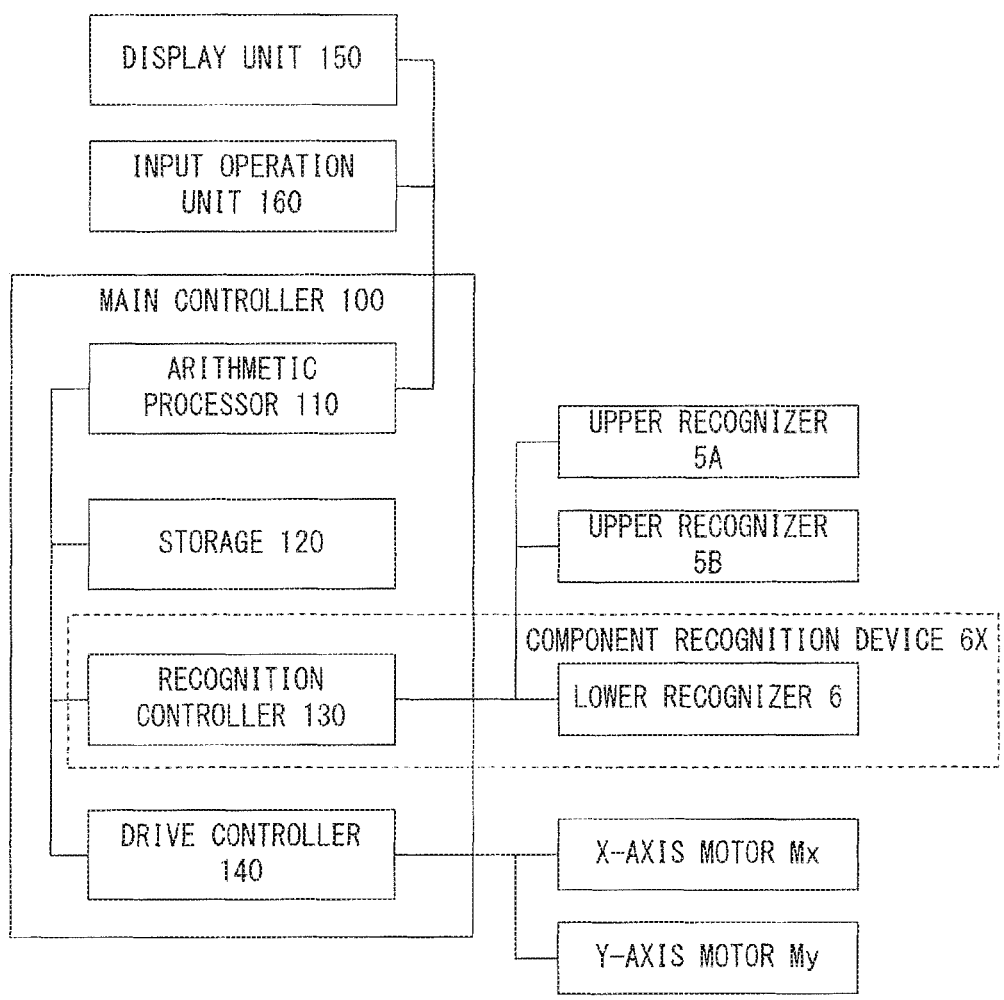
FIG. 3 is a block diagram showing an example of the electrical configuration of the surface mounter of FIG. 1.

FIG. 3 is a block diagram showing an example of the electrical configuration of the surface mounter of FIG. 1. The surface mounter 1 includes a main controller 100 for totally controlling the configuration of the entire machine, and the main controller 100 includes an arithmetic processor 110, a storage 120, a recognition controller 130 and a drive controller 140. The arithmetic controller 110 is a computer including a CPU (Central Processing Unit), a RAM (Random Access Memory) and the like. Further, the storage 120 is including a HDD (Hard Disk Drive) and the like and stores a mounting program for specifying a procedure of component mounting in the surface mounter 1, a program for specifying a procedure of a flow chart of FIG. 4 to be described later, and the like.

The recognition controller 130 controls a recognition process using the upper recognizers 5A, 5B and 6. That is, the recognition controller 130 outputs an imaging control signal to the upper recognizers 5A, 5B and 6 and the upper recognizers 5A, 5B and 6 image the imaging object J at a timing corresponding to the received imaging control signal. Then, the recognition controller 130 obtains information on the position of the imaging object J on the basis of the respective imaged images of the upper recognizers 5A, 5B and 6.

Figure 5:
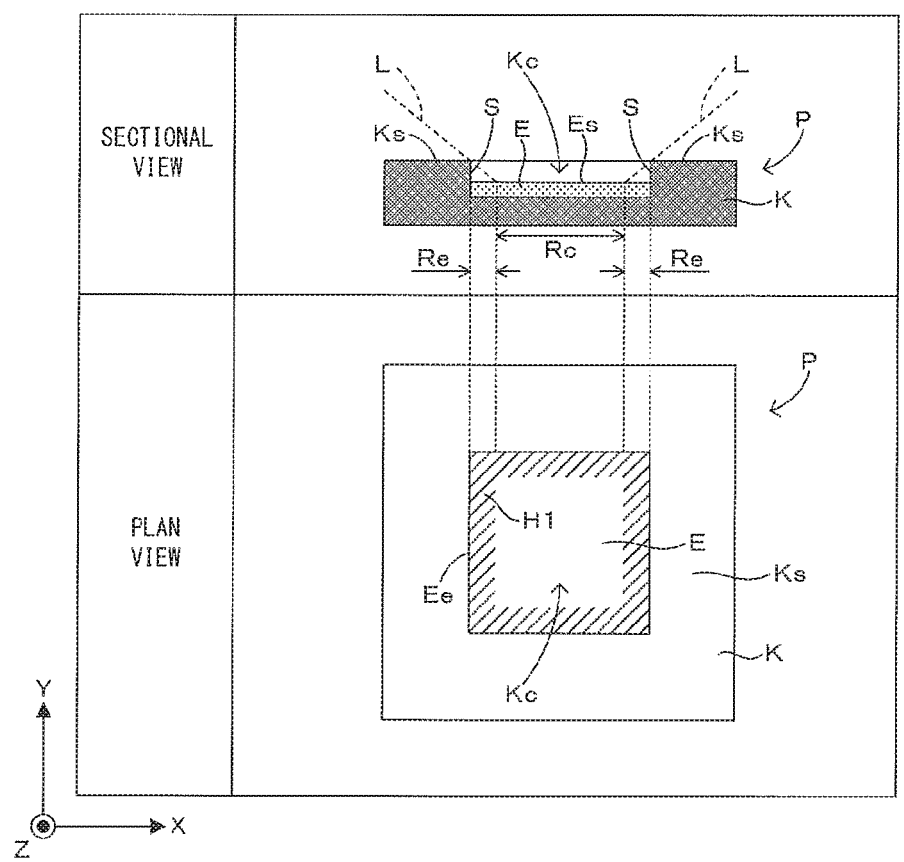
FIG. 5 is a diagram schematically showing an operation performed in the light emitter recognition process.
Figure 6:
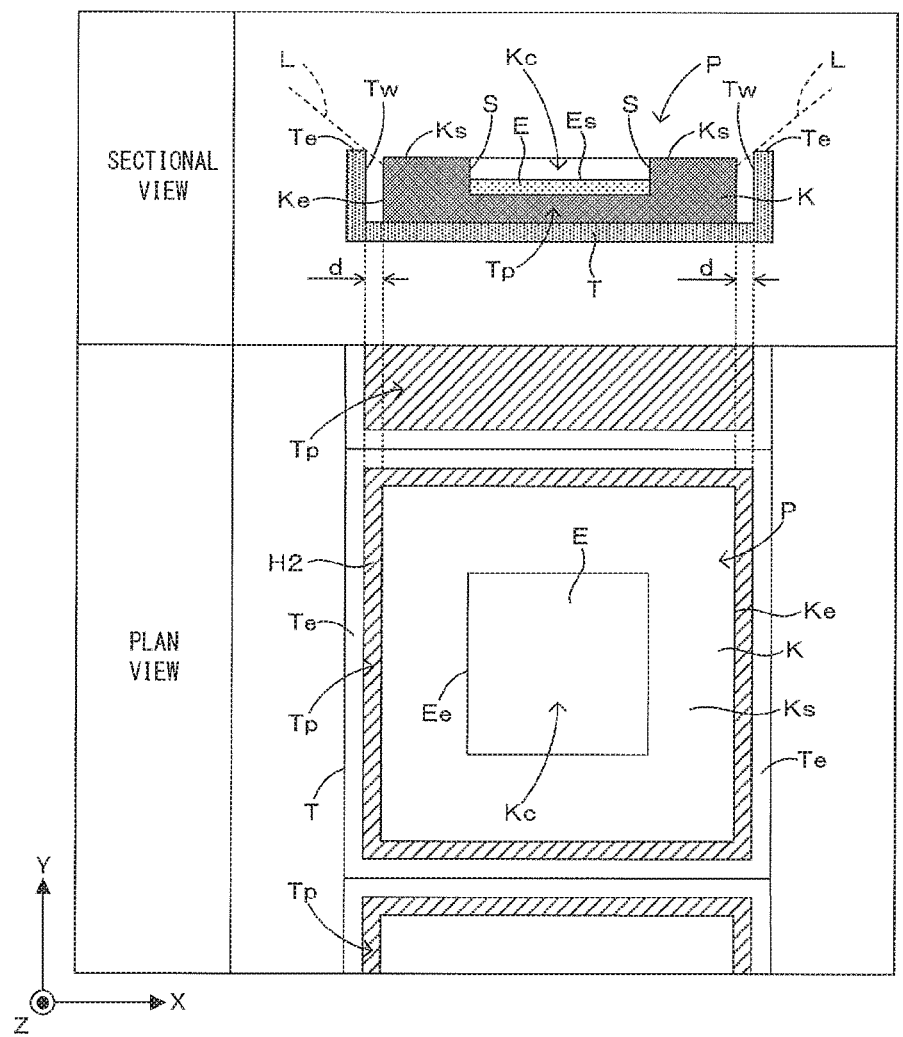
FIG. 6 is a diagram schematically showing an operation performed in the component outer shape recognition process.

For example, in the case of recognizing the position of the fiducial mark F, the light irradiator 65 irradiates light to the fiducial mark F provided on the board B and the camera 61 images the fiducial mark F irradiated with light from the light irradiator 65. Then, the recognition controller 130 recognizes the position of the board B loaded to the operating position Bo on the basis of a calculation result of the position of the fiducial mark F from an image imaged by the camera 61. Alternatively, in the case of recognizing the position of the component P, a process to be described in detail later using FIGS. 4 to 6 is performed by the recognition controller 130.

The drive controller 140 moves the head unit 3 in the X direction and the Y direction by controlling the X-axis motor Mx and the Y-axis motor My. Specifically, the drive controller 140 moves the mounting head 31 mounted on the head unit 3 between the component supply unit 25 and the board B when the component mounting is performed. At this time, the drive controller 140 corrects the XY position of the mounting head 31 on the basis of the position of the component P recognized by the recognition controller 130.

Further, the surface mounter 1 includes a display unit 150, for example, constituted by a liquid crystal display and an input operation unit 160, for example, constituted by a mouse or a keyboard. Accordingly, an operator can recognize a state of the surface mounter 1 by recognizing a display on the display unit 150 and can input a command to the surface mounter 1 by performing an input operation to the input operation unit 160. Incidentally, the display unit 150 and the input operation unit 160 need not be necessarily separately configured and may be integrally configured, for example, by a touch panel display.

Figure 4:
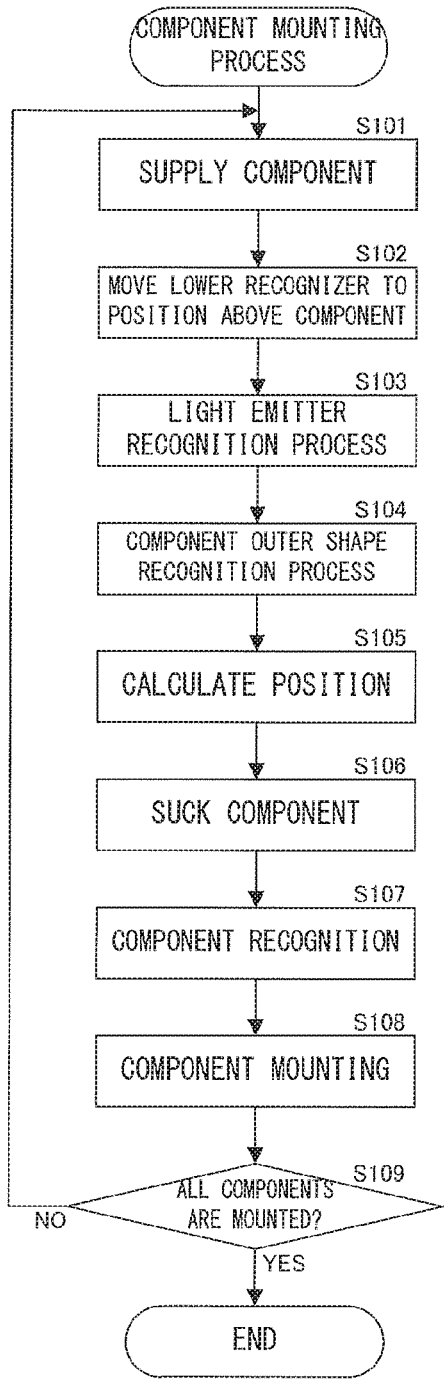
FIG. 4 is a flow chart showing an example of a component mounting process performed by the surface mounter of FIG. 1.

FIG. 4 is a flow chart showing an example of a component mounting process performed by the surface mounter of FIG. 1. The flow chart of FIG. 4 is executed by a control by the main controller 100. When the tape feeder 26 of the component supply unit 25 supplies the component P to the component take-out position in Step S101, the camera 61 of the lower recognizer 6 moves to a position above this component P in Step S102.

In Step S103, a light emitter recognition process is performed for the component P at the component take-out position. FIG. 5 is a diagram schematically showing an operation performed in the light emitter recognition process, wherein a partial sectional view of the component is shown in a field "Sectional View" of FIG. 5 and a partial plan view of the component is shown in a field "Plan View" of FIG. 5. The component 5 shown in FIG. 5 is an LED of a so-called surface mounting type.

This component P includes a light emitter E that emits light and a package K that supports the light emitter E. The package K has a rectangular outer shape in a plan view and a recess Kc having a rectangular parallelepiped shape is provided in a central part of the package K. The light emitter E is arranged on a bottom part of this recess Kc. With the component P held by the tape feeder 26, a surface Ks of the recess Kc and a surface Ec of the light emitter E are respectively horizontally held. An inner wall of the recess Kc surrounding a peripheral edge Ee of the light emitter E while being adjacent to this peripheral edge Ee projects further than the surface Es of the light emitter E to form a step S between the light emitter E and the package K. As just described, the package K has the step S between the light emitter E and the package K along the peripheral edge Ee of the light emitter E.

In the light emitter recognition process, light L is irradiated from the light irradiator 65 of the lower recognizer 6 toward the component P held by the tape feeder 26. In this way, the light L to be obliquely incident on the component P (surface Ks of the package K and surface Es of the light emitter E) from a side outward of the component P is irradiated to a range including the light emitter E. At this time, since part of the light L is blocked by the step S, the quantity of the light L incident on a peripheral edge part Re of the light emitter E is less than the quantity of the light L incident on the surface Ks of the package K and the quantity of the light L incident on a central part Rc of the light emitter E. Thus, a shadow H1 of the step S is formed on the peripheral edge part Re of the light emitter E as shown by hatching in the "Plan View" of FIG. 5. That is, the light irradiator 65 of the lower recognizer 6 has a function of forming the shadow H1 along the step S (in other words, along the peripheral edge part Ee of the light emitter E). As a result, contrast is created to make the peripheral edge part Re of the light emitter E darker than the surface Ks of the package K. In the light emitter recognition process in Step S103, an imaged image shown in the "Plan View" of FIG. 5 is obtained by imaging an image including the shadow H1 formed in this way by the camera 61 of the lower recognizer 6, and this imaged image is output to the recognition controller 130.

In Step S104, a component outer shape recognition process is performed for the component P at the component take-out position. FIG. 6 is a diagram schematically showing an operation performed in the component outer shape recognition process, wherein a partial sectional view of the component and the tape storing this component is shown in a field "Sectional View" of FIG. 6 and a partial plan view of the component and the tape storing this component is shown in a field "Plan View" of FIG. 6.

In the tape T loaded and held in the tape feeder 26, a plurality of pockets Tp each having a rectangular shape in a plan view are arranged in a row in the Y direction, and the component P is stored in each pocket Tp. The pocket Tp is larger than the package K of the component P in each of the X direction and the Y direction and a clearance d is formed between the package K of the component P stored in the pocket Tp and an inner wall Tw of the pocket Tp.

In the component outer shape recognition process, light L is irradiated from the light irradiator 65 of the lower recognizer 6 toward the pocket Tp storing the component P at the component take-out position. In this way, the light L to be obliquely incident on the component P (surface Ks of the package K) stored in the pocket Tp from a side outward of the pocket Tp is irradiated to a range including the pocket Tp. At this time, since part of the light L is blocked by a peripheral edge part Te of the pocket Tp, the quantity of the light L incident on the clearance d between the inner wall Tw of the pocket Tp and the package K of the component P is less than the quantity of the light L incident on the surface Ks of the package K and the quantity of the light L incident on the peripheral edge part Te of the tape T. Thus, a shadow H2 is formed in the clearance d between the inner wall Tw of the pocket Tp and the package K of the component P as shown by hatching in the "Plan View" of FIG. 6. That is, the light irradiator 65 of the lower recognizer 6 has a function of forming the shadow H2 along the outer shape of the package K of the component P. As a result, contrast is created to make the clearance d between the inner wall Tw of the pocket Tp and the package K of the component P darker than the surface Ks of the package K of the component P and the peripheral edge part Te of the tape T. In the component outer shape recognition process in Step S104, an imaged image shown in the "Plan View" of FIG. 6 is obtained by imaging an image including the shadow H2 formed in this way by the camera 61 of the lower recognizer 6, and this imaged image is output to the recognition controller 130.

In Step S105, the position of the light emitter E with respect to the outer shape of the package K is calculated by the recognition controller 130 on the basis of the position of the shadow H1 imaged in Step S103 and the position of the shadow H2 imaged in Step S104. Specifically, a boundary between the surface Ks of the package K and the shadow H1 is extracted as a peripheral edge part Ee (in other words, a contour) of the light emitter E from the image (image in the "Plan View" of FIG. 5) obtained by imaging the shadow H1. This peripheral edge part Ee of the light emitter E can be extracted, for example, by performing edge detection for a brightness difference (i.e. contrast) between the surface Ks of the package K and the shadow H1. Further, a boundary between the shadow H2 and the surface Ks of the package K is extracted as a peripheral edge part Ke (in other words, a contour) of the package K from the image (image in the "Plan View" of FIG. 6) obtained by imaging the shadow H2. This peripheral edge part Ke of the package K can be extracted, for example, by performing edge detection for a brightness difference (i.e. contrast) between the surface Ks of the package K and the shadow H2. Then, the position of the light emitter E with respect to the outer shape of the package K is calculated on the basis of respective extraction results of the position of the peripheral edge part Ee of the light emitter E and the position of the peripheral edge part Ke of the package K.

In Step S106, the mounting head 31 moves to a position above the component P, to which the processings of Steps S103 and S104 were performed, and sucks this component. Then, in a component recognition process of Step S107, the mounting head 31 moves to a position above the imager of the closer one of the upper recognizers 5A, 5B, and the imager images the bottom surface of the package K of the component P passing thereabove and sends the imaged bottom surface to the recognition controller 130. In this way, a positional relationship of the package K of the component P sucked by the mounting head 31 and the mounting head 31 is recognized by the recognition controller 130.

Then, in component mounting of Step S108, the drive controller 140 controls the position of the mounting head 31 with respect to the board B in the X direction and the Y direction on the basis of the position of the light emitter E with respect to the package K obtained in Step S105 and the position of the package K with respect to the mounting head 31 obtained in Step S107. At this time, the position of the board B recognized on the basis of the fiducial marks F is referred to. In this way, the component P is so mounted on the board B that the light emitter E is aligned with a predetermined XY position. Steps S101 to S108 are repeatedly performed until all the components are mounted (until "YES" is judged in Step S109).

In the embodiment thus configured, the shadow H1 (first shadow) is formed along the step S between the light emitter E and the package K of the component P by irradiating the light L toward the component P (light emitter recognition process of Step S103). Thus, the boundary (peripheral edge part Ee) between the package K adjacent to the light emitter E and the light emitter E is emphasized by the shadow H1, wherefore the position of the light emitter E of the component P can be precisely recognized regardless of whether or not the light emitter E of the component P includes phosphors.

Incidentally, the component recognition process can adapt to both the light emitter E including phosphors and the light emitter E including no phosphor. Note that if the light emitter E includes no phosphor, the illuminators 67 of the light irradiator 65 may irradiate light L (e.g. visible light) in a wavelength range detectable by the solid state image sensor 62 (detection wavelength range).

Alternatively, if the light emitter E includes phosphors to be excited by the irradiation of light having a wavelength in a predetermined excitation wavelength range, the illuminators 67 of the light irradiator 65 may irradiate light which has a wavelength within the detection wavelength range and outside the excitation wavelength range (i.e. does not have a wavelength within the excitation wavelength range) and does not excite the phosphors. This can prevent the shadow H1 formed along the step S between the light emitter E and the package K of the component P from becoming lighter by the excitation and light emitting of the phosphors of the light emitter E. Thus, the position of the light emitter E of the component P can be precisely recognized by emphasizing the boundary between the package K adjacent to the light emitter E and this light emitter E by the shadow H1.

Incidentally, to excite the phosphors of the light emitter E, light having a wavelength within the excitation wavelength range and having a light quantity equal to or more than a predetermined value needs to be irradiated to the phosphors. In such a case, even if light having a wavelength within the excitation wavelength range is irradiated, the phosphors of the light emitter E are not excited if the light quantity of the light is below the predetermined value. Accordingly, the illuminators 67 of the light irradiator 65 may irradiate light having a wavelength within the detection wavelength range and within the excitation wavelength range and having a light quantity below the predetermined value to the component P. Also by this, the shadow H1 can be prevented from becoming lighter by the excitation and light emission of the phosphors of the light emitter E and the position of the light emitter E of the component P can be precisely recognized.

Further, in the component outer shape recognition process of Step S104, the shadow H2 (second shadow) is formed in the clearance d between the inner wall Tw of the pocket Tp storing the component P and the package K of the component P by irradiating the light L toward the component P. Accordingly, the outer shape (peripheral edge Ke) of the package K of the component P is emphasized by the shadow H2, wherefore the position of the package K of the component P can be precisely recognized, with the result that the position of the light emitter E with respect to the package K can also be precisely recognized. Based on such recognition results, the XY position to which the mounting head 31 mounts the component P on the board B is controlled, wherefore the light emitter E of the component P can be mounted at the proper XY position on the board B.

Further, each of the fiducial marks F and the component P is recognized by the lower recognizer 6 and the recognition controller 130. By commonly using a configuration for recognizing each of the fiducial marks F and the component P in this way, the configuration of the surface mounter 1 is simplified.

As just described, in the above embodiment, the surface mounter 1 corresponds to a "surface mounter" of the disclosure, the tape feeder 26 corresponds to an example of a "component holder" of the disclosure, the component P corresponds to an example of a "component" of the disclosure, the light emitter E corresponds to an example of a "light emitter" of the disclosure, the peripheral edge Ee corresponds to an example of a "peripheral edge of the light emitter" of the disclosure, the package K corresponds to an example of a "package" of the disclosure, the step S corresponds to an example of a "step" of the disclosure, the light irradiator 65 corresponds to an example of a "light irradiator" of the disclosure, the light L corresponds to an example of "light" of the disclosure, the shadow H1 corresponds to an example of a "first shadow" of the disclosure, the camera 61 corresponds to an example of an "imager" of the disclosure, the recognition controller 130 corresponds to an example of a "position recognizer" of the disclosure, the mounting head 31 corresponds to an example of a "mounting head" of the disclosure, the board B corresponds to an example of a "board" of the disclosure, the drive controller 140 corresponds to an example of a "mounting controller" of the disclosure, the tape T corresponds to an example of a "tape" of the disclosure, the pocket Tp corresponds to an example of a "pocket" of the disclosure, the inner wall Tw corresponds to an example of a "wall surface of the pocket" of the disclosure, the clearance d corresponds to an example of a "clearance" of the disclosure, the shadow H2 corresponds to an example of a "second shadow" of the disclosure, the fiducial mark F corresponds to an example of a "fiducial mark" of the disclosure, and a component recognition device 6X (FIG. 3) including the lower recognizer 6 and the recognition controller 130 corresponds to an example of a "component recognition device" of the disclosure.

Note that the disclosure is not limited to the above embodiment and various changes other than the aforementioned ones can be made without departing from the gist of the disclosure. For example, in the flow chart of FIG. 4, the component outer shape recognition process of Step S104 is performed after the light emitter recognition process of Step S103 is performed. However, an execution sequence of these may be reversed.

Alternatively, if the intensity of the light irradiated from the light irradiator 65 can be made equal in the light emitter recognition process and the component outer shape recognition process, i.e. if the shadows H1 and H2 can be simultaneously formed by light having the same intensity, the light emitter recognition process and the component outer shape recognition process may be simultaneously performed. This enables the shadows H1 and H2 to be efficiently imaged at one time.

Alternatively, if the light emitter recognition process and the component outer shape recognition process are performed at individual timings, the light irradiated from the light irradiator 65 in the component outer shape recognition process may be more intensified than the light irradiated from the light irradiator 65 in the light emitter recognition process. In such a configuration, the outer shape of the package K of the component P can be emphasized by the shadow H2 by ensuring contrast between the clearance d between the inner wall Tw of the pocket Tp and the package K of the component P and the package K of the component P.

Further, the intensity of the light irradiated from the light irradiator 65 in each of the light emitter recognition process and the component outer shape recognition process can be variously adjusted. Accordingly, in the light emitter recognition process, such light L to be reflected by the surface Ks of the package K with an intensity equal to or higher than a detectable range of the solid state image sensor 62 and to cause brown-out highlights in the image of the surface Ks of the package K may be irradiated from the light irradiator 65. In this way, the light emitter E can be more precisely recognized by reliably ensuring contrast between the surface Ks of the package K and the shadow H1 Similarly, also in the component outer shape recognition process, contrast between the surface Ks of the package K and the shadow H2 can be more reliably ensured and the outer shape of the package K can be more precisely recognized by irradiating from the light irradiator 65 such light as to cause brown-out highlights in the image of the surface Ks of the package K. Note that the light L causing brown-out highlights in the image of the surface Ks of the package K can be obtained by adjusting the intensity of the light L or an exposure time.

Further, the imaged image (image in the "Plan View" of FIG. 5) in the light emitter recognition process may be displayed on the display unit 150. This enables an operator to adjust, for example, the intensity or the exposure time of the light L irradiated from the light irradiator 65 while confirming the imaged image displayed on the display unit 150 such as when the shadow H1 cannot be properly extracted in the light emitter recognition process.

Further, the imaged image (image in the "Plan View" of FIG. 6) in the component outer shape recognition process may be displayed on the display unit 150. This enables the operator to adjust, for example, the intensity or the exposure time of the light L irradiated from the light irradiator 65 while confirming the imaged image displayed on the display unit 150 such as when the shadow H2 cannot be properly extracted in the component outer shape recognition process.

Further, the arranged positions, width or number of the illuminators 67 can also be appropriately changed. For example, light is irradiated to the component P from the two light irradiators 65 facing each other in a plan view in the above example. However, light may be irradiated to the component P from four light irradiators 65 arrayed to surround the opening 661 at an interval of 90° in a plan view. Alternatively, the illuminators 67 may be arranged in such an annular manner as to surround the opening 661. Furthermore, the incident angle θ of the optical axis A67 of the illuminator 67 on the component P can also appropriately changed. Accordingly, the illuminator 67 may be, for example, so arranged that the incident angle θ is in a range of 50° to 65°, in other words, an angle between the optical axis A67 of the illuminator 67 and the light emitter E of the component P is in a range of 25° to 40°.

Further, in the above example, the component P and the fiducial mark F are respectively recognized by irradiating light from the same light irradiator 65. At this time, an illuminance of the light irradiated from the light irradiator 65 in the recognition of the component P and that of the light irradiated from the light irradiator 65 in the recognition of the fiducial mark F may be changed. Alternatively, the angle θ (FIG. 2) of irradiation of the light may be changed in the case of recognizing the component P and in the case of recognizing the fiducial mark F. Specifically, the angle θ when the fiducial mark F is imaged may be made smaller than the angle θ when the light emitter E of the component P is imaged. Further, to make the angle θ of irradiation of the light to the light emitter E variable, the lower recognizer 6 may be so configured that a mounting angle of each light irradiator 65 can be automatically changed or the lower recognizer 6 may be provided with light irradiators 65 respectively corresponding to different angles θ.

Further, the specific shape of the component P is not limited to the example of FIGS. 5 and 6. Accordingly, the above embodiment can be applied also in recognizing a component P having a light emitter E or a package K, for example, circular in a plan view.

Further, the specific configuration for supplying the components P is not limited to the tape feeder 26. Accordingly, the above embodiment can be applied also in recognizing a component P supplied by a stick feeder or a tray feeder.

Further, in the lower recognizer 6, a mounting angle of the camera 61 can also be appropriately changed.

As described above by way of the specific example, various modifications described below can be appropriately added to the disclosure.

That is, the surface mounter may be configured so that the component holder holds a tape including a pocket storing the component; the light irradiator forms a second shadow in a clearance between a wall surface of the pocket and the package of the component by irradiating light toward the component; the imager images an image including the second shadow; the position recognizer recognizes a position of the light emitter with respect to the package on the basis of positions of the respective imaged first shadow and second shadow, and the mounting controller controls the position where the mounting head mounts the component on the board on the basis of the position of the light emitter with respect to the package recognized by the position recognizer. Such a configuration causes the second shadow to be formed in the clearance between the wall surface of the pocket storing the component and the package of the component by irradiating the light toward the component. Thus, the outer shape of the package of the component is emphasized by the second shadow, wherefore the position of the package of the component can be precisely recognized, with the result that the position of the light emitter with respect to the package can also be precisely recognized. Since the position where the mounting head mounts the component on the board is controlled on the basis of such a recognition result, the light emitter of the component can be mounted at a proper position on the board.

The surface mounter may be configured so that the light irradiator simultaneously forms the first shadow and the second shadow by irradiating light toward the component; and the imager simultaneously images the first shadow and the second shadow. In such a configuration, the first shadow and the second shadow can be efficiently imaged at one time.

The surface mounter may be configured so that the imager images an image including the first shadow while the light irradiator forms the first shadow by irradiating light toward the component, and the imager images an image including the second shadow while the light irradiator forms the second shadow by irradiating light stronger than the light when the first shadow is formed toward the component. In such a configuration, the outer shape of the package of the component can be emphasized by the second shadow by ensuring contrast between the clearance between the wall surface of the pocket and the package of the component and the package of the component.

The surface mounter may be configured so that the light emitter includes phosphors to be excited by the irradiation of light having a wavelength in a predetermined range; and the light irradiator irradiates light that has a wavelength outside the predetermined range and does not excite the phosphors to the component. Such a configuration can prevent the shadow formed along the step between the light emitter and the package of the component from becoming lighter by the excitation and light emitting of the light emitter. Thus, the position of the light emitter of the component can be precisely recognized by emphasizing a boundary between the package adjacent to the light emitter and the light emitter by the shadow.

The surface mounter may be configured so that the light irradiator irradiates light to a fiducial mark provided on the board; the imager images the fiducial mark irradiated with the light from the light irradiator; and the position recognizer recognizes a position of the board from the position of the fiducial mark imaged by the imager. In such a configuration, the light irradiator and the imager can be commonly used to image a shadow of the boundary between the package adjacent to the light emitter and the light emitter and to image the fiducial mark of the board, and the device configuration can be simplified.

This disclosure can be applied to techniques in general for recognizing the position of a light emitter of a component configured to emit light from the light emitter.

What is claimed is:

1. A surface mounter, comprising:
a component holder configured to hold a component, the component including a light emitter to emit light and a package having a step between the light emitter and the package along a peripheral edge of the light emitter;
a light irradiator configured to form a first shadow along the step by irradiating light toward the component;
an imager configured to image an image including the first shadow;
a position recognizer configured to recognize a position of the light emitter from a position of the imaged first shadow;
a mounting head configured to mount the component taken out from the component holder on a board; and
a mounting controller configured to control a position where the mounting head mounts the component on the board on the basis of the position of the light emitter recognized by the position recognizer.

2. The surface mounter according to claim 1, wherein:
the component holder is configured to hold a tape including a pocket storing the component;
the light irradiator is configured to form a second shadow in a clearance between a wall surface of the pocket and the package of the component by irradiating light toward the component;
the imager is configured to image an image including the second shadow;
the position recognizer is configured to recognize a position of the light emitter with respect to the package on the basis of positions of the respective imaged first shadow and second shadow; and
the mounting controller is configured to control the position where the mounting head mounts the component on the board on the basis of the position of the light emitter with respect to the package recognized by the position recognizer.

3. The surface mounter according to claim 2, wherein:
the light irradiator is configured to simultaneously form the first shadow and the second shadow by irradiating light toward the component; and
the imager is configured to simultaneously image the first shadow and the second shadow.

4. The surface mounter according to claim 2, wherein:
the imager is configured to image an image including the first shadow while the light irradiator forms the first shadow by irradiating light toward the component;
and the imager is configured to image an image including the second shadow while the light irradiator forms the second shadow by irradiating light stronger than the light when the first shadow is formed toward the component.

5. The surface mounter according to claim 1, wherein:
the light emitter includes phosphors to be excited by the irradiation of light having a wavelength in a predetermined range; and
the light irradiator is configured to irradiate light that has a wavelength outside the predetermined range and does not excite the phosphors to the component.

6. The surface mounter according to claim 1, wherein:
the light irradiator is configured to irradiate light to a fiducial mark provided on the board;
the imager is configured to image the fiducial mark irradiated with the light from the light irradiator; and
the position recognizer is configured to recognize a position of the board from the position of the fiducial mark imaged by the imager.

7. A component recognition device, comprising:
a light irradiator configured to irradiate a light toward a component that includes a light emitter to emit light and a package having a step between the light emitter and the package along a peripheral edge of the light emitter, to form a shadow along the step;

an imager configured to image an image including the shadow; and a position recognizer configured to recognize a position of the light emitter on the basis of a position of the imaged shadow.

8. A component recognition method, comprising:

forming a shadow along a step by irradiating light toward a component that includes a light emitter to emit light and a package having the step between the light emitter and the package along a peripheral edge of the light emitter;

imaging an image including the shadow; and recognizing a position of the light emitter from a position of the imaged shadow.

9. The surface mounter according to claim 2, wherein:

the light emitter includes phosphors to be excited by the irradiation of light having a wavelength in a predetermined range; and the light irradiator is configured to irradiate light that has a wavelength outside the predetermined range and does not excite the phosphors to the component.

10. The surface mounter according to claim 3, wherein:

the light emitter includes phosphors to be excited by the irradiation of light having a wavelength in a predetermined range; and the light irradiator is configured to irradiate light that has a wavelength outside the predetermined range and does not excite the phosphors to the component.

11. The surface mounter according to claim 4, wherein:

the light emitter includes phosphors to be excited by the irradiation of light having a wavelength in a predetermined range; and the light irradiator is configured to irradiate light that has a wavelength outside the predetermined range and does not excite the phosphors to the component.

12. The surface mounter according to claim 2, wherein:

the light irradiator is configured to irradiate light to a fiducial mark provided on the board;

the imager is configured to image the fiducial mark irradiated with the light from the light irradiator; and the position recognizer is configured to recognize a position of the board from the position of the fiducial mark imaged by the imager.

13. The surface mounter according to claim 3, wherein:

the light irradiator is configured to irradiate light to a fiducial mark provided on the board;

the imager is configured to image the fiducial mark irradiated with the light from the light irradiator; and the position recognizer is configured to recognize a position of the board from the position of the fiducial mark imaged by the imager.

14. The surface mounter according to claim 4, wherein:

the light irradiator is configured to irradiate light to a fiducial mark provided on the board;

the imager is configured to image the fiducial mark irradiated with the light from the light irradiator; and the position recognizer is configured to recognize a position of the board from the position of the fiducial mark imaged by the imager.

15. The surface mounter according to claim 5, wherein:

the light irradiator is configured to irradiate light to a fiducial mark provided on the board;

the imager is configured to image the fiducial mark irradiated with the light from the light irradiator; and the position recognizer is configured to recognize a position of the board from the position of the fiducial mark imaged by the imager.

16. The surface mounter according to claim 9, wherein:

the light irradiator is configured to irradiate light to a fiducial mark provided on the board;

the imager is configured to image the fiducial mark irradiated with the light from the light irradiator; and the position recognizer is configured to recognize a position of the board from the position of the fiducial mark imaged by the imager.

17. The surface mounter according to claim 10, wherein:

the light irradiator is configured to irradiate light to a fiducial mark provided on the board;

the imager is configured to image the fiducial mark irradiated with the light from the light irradiator; and the position recognizer is configured to recognize a position of the board from the position of the fiducial mark imaged by the imager.

18. The surface mounter according to claim 11, wherein:

the light irradiator is configured to irradiate light to a fiducial mark provided on the board;

the imager is configured to image the fiducial mark irradiated with the light from the light irradiator; and the position recognizer is configured to recognize a position of the board from the position of the fiducial mark imaged by the imager.

* * * * *